United States Patent [19]

Tan

[11] 4,278,867
[45] Jul. 14, 1981

[54] SYSTEM FOR CHIP JOINING BY SHORT WAVELENGTH RADIATION

[75] Inventor: Swie-In Tan, Bedford Hills, N.Y.

[73] Assignee: International Business Machines Corporation, Armonk, N.Y.

[21] Appl. No.: 974,595

[22] Filed: Dec. 29, 1978

[51] Int. Cl.³ .................. B23K 26/02; B23K 26/12
[52] U.S. Cl. .................. 219/121 LD; 219/121 LC; 219/85 BM; 219/85 BA
[58] Field of Search .......... 219/56.21, 85 BA, 85 BM, 219/85 E, 85 F, 85 G, 85 M, 121 L, 121 LM, 121 LC, 121 LD

[56] References Cited

U.S. PATENT DOCUMENTS

| 3,735,911 | 5/1973 | Ward | 228/19 |
| 3,742,181 | 6/1973 | Costello | 219/85 BA |
| 3,826,578 | 7/1974 | King et al. | 219/121 L X |
| 3,934,073 | 1/1976 | Ardezzone | 219/121 LM X |
| 4,022,370 | 5/1977 | Durney | 219/85 BA X |

FOREIGN PATENT DOCUMENTS 2360308  6/1974  Fed. Rep. of Germany ....... 219/121 L

OTHER PUBLICATIONS

*IBM Technical Disclosure Bulletin;* vol. 20, No. 10, Mar. 1978, pp. 3908–3909, "Applying Radiant Heat to Semiconductor Integrated Circuits", by R. F. Lever.

S. S. Charschan; *Lasers in Industry,* Van Nostrand Reinhold Co., N.Y., 1972, pp. 44–46.

*Primary Examiner*—Gerald P. Tolin
*Assistant Examiner*—Keith E. George
*Attorney, Agent, or Firm*—Graham S. Jones, II

[57] ABSTRACT

Defective chips are removed from a substrate package. The package is cleaned. Replacement chips with solder bearing elements are replaced in the position(s) of the defective chip(s). Silicon chips are less damaged by heating with light wavelengths substantially shorter than infrared radiation, when the radiation is directed upon the upper chip surface and the lower chip surface carries circuitry and solder balls. Radiation is absorbed by the upper chip surface and converted there directly to heat, protecting the circuitry below. An argon-ion laser beam confined to a given chip is directed upon the upper surface of the chip to be soldered in place. A thin laser beam can be scanned under computer control across a chip to heat the areas of a chip above solder balls. Automatic temperature control of the chip can be provided by a heat detector or chip condition detector and a program controller in a feedback loop controlling laser power.

10 Claims, 4 Drawing Figures

SYSTEM FOR CHIP JOINING BY SHORT WAVELENGTH RADIATION

DESCRIPTION

1. Technical Field

This invention relates to metal working systems and more particularly to systems including assembly into electrical circuits of integrated circuits which are replaced to repair the assembly.

2. Background Art

In reworking of LSI multichip packages in which solder ball packaging is employed, in the past, removal of defective chips has involved pulling or ripping away the old chip, cleaning the remaining solder away mechanically, reinserting the replacement chip and then subjecting the entire package to the standard solder reflow heating which involves heating the entire package including every chip. This has been in many cases undesirable since the reheating has proved to be damaging to the chips which were not being replaced.

U.S. Pat. No. 3,735,911 of Ward, commonly assigned, describes a flame heating system producing infrared heat, which includes an infrared temperature sensor for controlling the temperature of the heated chip by turning off the flame after the chip temperature exceeds a permissable value.

U.S. Pat. No. 3,402,460 of Smith describes direct laser heating of leads and an exposed P- or N-type area to which the lead is to be bonded. The laser beam reaches directly to the lead and a doped silicon region of a semiconductor device heating the conductor to fuse it to the silicon. The laser wavelength was selected to be 10,600 Å (neodymium laser) in order to produce light near 11,000 Å which is the critical wavelength of silicon at which the absorption coefficient of silicon is relatively low so that the energy of the laser beam will pass through the silicon and will not be concentrated at the surface of the silicon chip to avoid thermal damage because the heat penetrates deeply into the wafer rather than concentrating at the surface of the wafer.

U.S. Pat. No. 3,614,832 commonly assigned also teaches laser welding of leads to a chip by directing the beam at the top of a chip to join a conductive strip 21, a lead 13 and metallic contacts 17 by a solder reflow technique using 90% lead, 10% tin solder, where the lead and the contact are precoated with tin solder. The variety of laser is not identified.

U.S. Pat. No. 3,970,819 describes heating the back side of a semiconductor chip with a laser to reduce the breaking strength of the chip so individual devices on the chip can be separated into individual chips.

U.S. Pat. No. 3,934,073 shows a technique for using a laser to bond a lead to a land on a chip. The difference is that the lead is supported on a glass substrate and the laser beam must be shone through the glass to the lead. A Korad ruby red laser was used. No suggestion of an opaque substrate, application to the back of the chip, etc. is disclosed.

U.S. Pat. No. 3,435,186 is of interest as to laser machining of the back of an object but the substrate is transparent and the coating is opaque.

U.S. Pat. No. 3,485,996 of Chiou et al shows passing laser light through a transparent substrate to heat metallization to weld it to lands on a substrate and a chip, with feedback control of the laser based upon what metal is struck by the beam, gold or alumina.

In D. Giacomo et al "Prevention of Land Opens During Infrared Rework of Chips," IBM Technical Disclosure Bulletin 20, No. 8, 3216–3217 (January 1978), a chip is heated by a source of radiation, the portion of the spectrum above 1 micron is filtered so that only the spectrum of 0.25 to 1 micron is allowed to irradiate the chips.

DISCLOSURE OF INVENTION

This invention is performed in a chamber from which air has been evacuated. The chamber is then backfilled with an inert gas in order to prevent oxidation of the solder and the pads and to prevent carbonization and breakdown of the flux used in the soldering process. Because the process must be performed in an enclosed, sealed chamber which prevents easy access to the work, an automatic process maximizes efficiency. As only some chips need to be replaced and as heating of a package carrying several chips to high temperatures involves the risk of damaging the chips, an important advantage of the present invention is that it provides a way in which an individual chip can be heated to a sufficient temperature to solder it in place without unduly heating the neighboring chips upon the substrate package. In addition, this process takes into account the discovery that chips will be less damaged by heating with a source of light having wavelengths substantially shorter than infrared radiation, when the radiation is directed upon the upper surface of a silicon chip (or the like) when the lower surface of the chip carries circuitry and solder balls. Since silicon is opaque to shorter wavelengths, the radiation is absorbed by the upper surface of the chip and converted directly to heat there, protecting the metallization, transistors and/or other elements of the circuitry below. Specifically, a short wavelength argon-ion laser beam confined to the surface area of a given chip is directed upon the upper (back) surface of the chip to be soldered in place. The laser light is absorbed by the upper surface of the chip and is not transmitted through the silicon of the chip, which has a critical wavelength at 11,000 Å, at which the absorption coefficient of the silicon is very low. The light has been selected to have a wavelength at which the silicon appears to be opaque, i.e., the absorption coefficient is very high. As a large source of noncoherent light with desirable wavelength characteristics has not been identified to date, a coherent source of light such as a laser whose intensity can be controlled by a temperature monitor is the preferred source.

Figure 1:
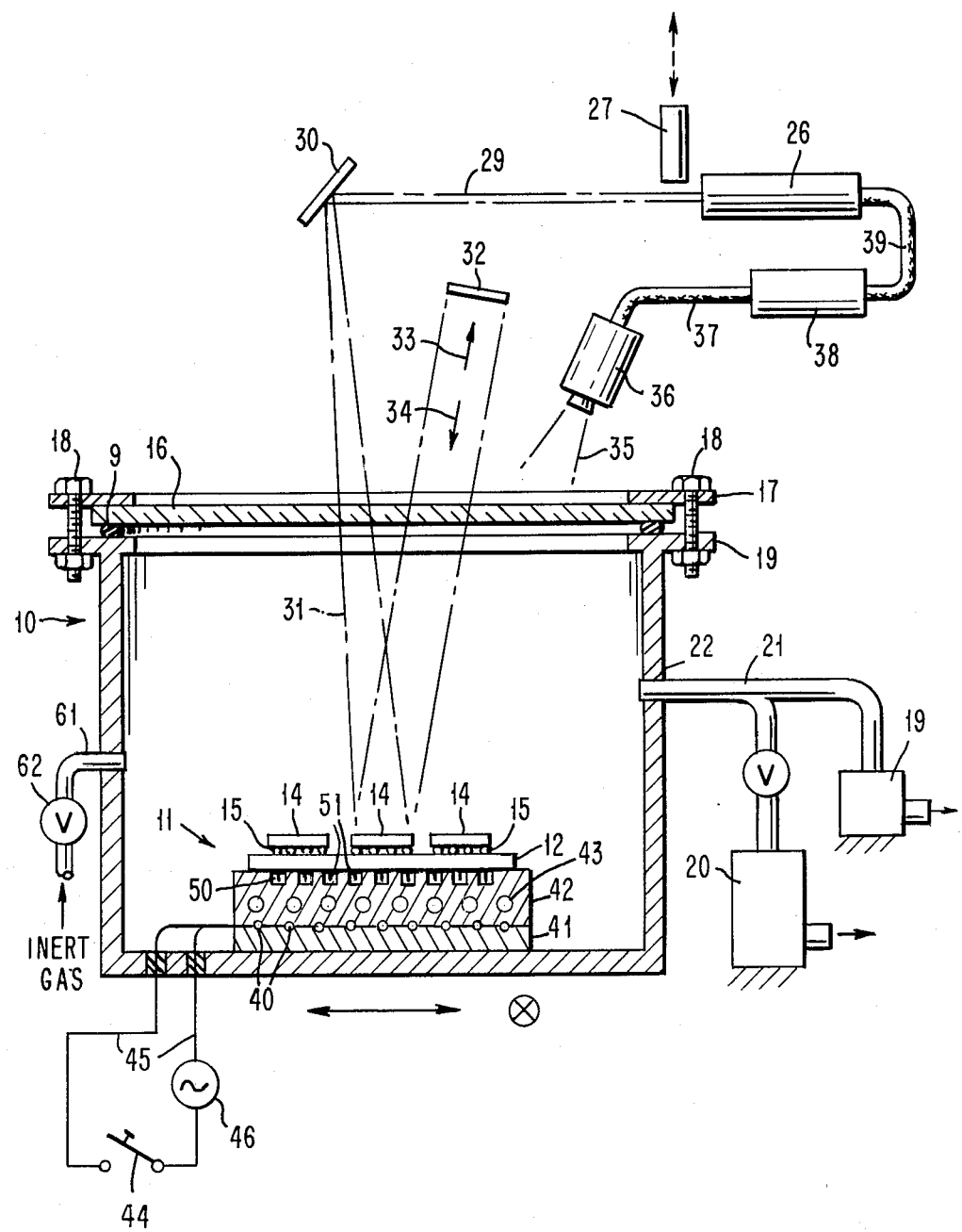
FIG. 1 shows a schematic elevational diagram of a feedback controlled laser operated system for joining a chip to a substrate package with a standard mechanical scanning arrangement (not shown).

FIG. 1 shows a cylindrical vacuum chamber 10 containing a work support 11 carrying a ceramic substrate package 12. A plurality of multicircuit chips 14 is supported upon the ceramic substrate package 12. Replacement chips 14 are to be electrically and mechanically secured to conductive contact pads upon the package 12 by means of conventional solder balls 15.

In a process known as "reworking," a chip 14 which is defective is removed from package 12 by ripping or pulling the chip away and cleaning away the solder remaining upon the pads, as is well known in the art.

This invention pertains to the process of replacing the chip removed with a new chip of similar characteristics but without the defect. The chip 14 to be joined to the package 12 has solder balls 15 and flux beneath it which must be protected from oxidation, as explained above. Thus, prior to joining the chip 14 and the package 12, the cylindrical vacuum chamber 10 is evacuated by roughing pump 19 and diffusion pump 20 connected by conduits 21 through opening 22 in the sidewall of chamber 10. Subsequently, the chamber 10 is refilled via valve 62 and line 61 with an inert gas such as argon, nitrogen, hydrogen, neon, xenon, krypton, helium, or mixtures of the above, etc. for the purpose of protecting the solder balls 15, the pads and the flux while they are being heated.

In FIG. 1 three chips 14 are shown to represent a large number of chips in a single row with several rows of chips extending back into the page. The chip 14 in the center is the one which is being joined to package 12 by means of heat from a square cross-section laser beam 31 for the square chip 14 (chips of different shapes would be heated by appropriately shaped beams). The source of the beam 31 is a laser 26, preferably an argon-ion laser which emits energy at wavelengths from 4579 Å to 5145 Å. Those wavelengths are so short that the chip 14 having a silicon substrate has a high absorption coefficient of about $1.5 \times 10^4$ cm$^{-1}$ at those wavelengths. This means that the entire incident energy of the laser beam 31 is absorbed within the first 10 micrometers of thickness of the chip 14. Since the chip 14 has a substrate thickness of several hundred micrometers, the circuitry on the lower surface of the chip is protected from overheating by the large energy absorbing capacity of the silicon in chip 14. The chip 14 is heated relatively uniformly because of the shape of the laser beam 31 and the absorption of the heat on the top surface of chip 14 from which it passes very quickly to the lower surface because the chip is so thin.

As stated above, the laser beam 31 is shaped to match the shape of the top surface of a chip 14. For a square chip, a square beam 31 is projected. The beam 29 from laser 26 is not square and it does not have the usual Gaussian variation in intensity of usual laser reflecting mirrors. Instead, the beam 29 leaving laser 26 is cylindrical and is of relatively uniform intensity everywhere within the cross-section of the beam. This is achieved by replacing the usual mirrors by more concave mirrors (reflectors) at opposite ends of the laser light source within laser 26, with the back mirror 100% reflective and the front mirror about 85% reflective. Preferably, a confocal configuration in which the distance between the mirrors is equal to twice the focal length is employed.

A mirror 30 is placed to receive cylindrical beam 29 and to reflect it down upon chip 14 in a square configuration. Mirror 30 is a beam integrator which transforms the circular beam 29 into the square beam 31. For a rectangular chip 14 the mirror 30 will produce a rectangular beam of a substantially uniform cross-sectional intensity.

The beam 31 from mirror 30 passes to chip 14 through a transparent window 16 (calcium fluoride or glass) which is clamped by an annular metallic frame 17 which is secured to a flange 19 by nuts and bolts 18. A calcium fluoride window 16 is used where infrared light must pass through to a sensor outside the chamber window 16. Window 16 is sealed to flange 19 by means of a conventional elastomeric O-ring seal 9 of the variety usually employed in vacuum systems. A substantial quantity of the light from beam 31 is reflected from chip 14 back up to mirror 32 which is a preferably flat mirror which redirects the light back down upon chip 14 in order to conserve energy. All mirrors used must be highly reflective at the laser frequency used. The laser 26, laser shutter 27, mirror 30 and mirror 32 are all rigidly supported by means now shown in a way which will be obvious to one skilled in the art.

The chamber 10 and the vacuum pumps 19 and 20 are supported upon a pedestal now shown which is slidably supported for horizontal motion in x and y directions at right angles independently by cranking a screw drive to place a specific chip 14 desired beneath the beam 31.

Thus, with laser shutter 27 blocking beam 29, the chamber 10 can be moved into the position required to place the desired chip in line with beam 31. Then the shutter 27 is opened (as shown) to permit the chip 14 to be heated to solder it to the package 12.

The maximum temperature of a chip 14 occurs at its top surface while the laser beam 31 is directed upon it. In accordance with another aspect of this invention, the temperature of the upper surface of chip 14 is monitored by an infrared radiometer or detector 36 (of the type available commercially from Barnes Engineering). Detector 36 has its maximum sensitivity at the appropriate wavelength in the infrared range of wavelengths suitable to detect the desired process temperature.

Figure 2:
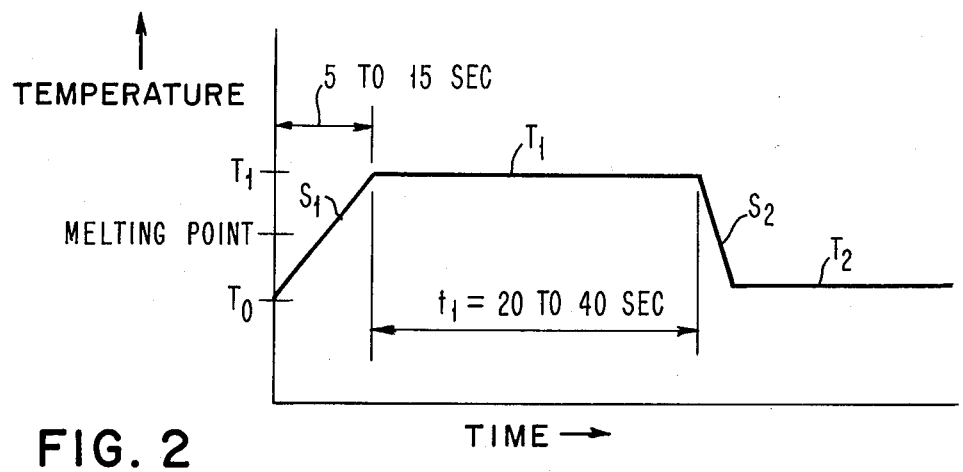
FIG. 2 is a diagram of temperature vs. time for heating of a chip to join solder balls to a package.

Detector 36 provides an output signal varying as a function of temperature, which signal is supplied by cable 37 to a feedback control system 38 connected via cable 39 to laser 26. System 38 is programmable to produce a predetermined temperature profile such as a Eurotherm Controller adapted to use for control in industrial environments which adjusts the output intensity of laser 26. There is a temperature profile such as shown in FIG. 2 which rises as shown above the melting point of solder balls 15 to prevent thermal shock. The upper level is 20°–50° C. above the melting point of the solder balls 15. Thus, chip 14 is heated automatically to the desired temperature which varies as a function of the intensity and duration of the laser beam 31. System 38 is discussed below in detail in connection with FIG. 3.

While the beam 31 shown here is broad enough to cover the entire chip, it is better where the locations of the solder balls 15 are irregular over the surface of a chip 14 to provide a pencil thin laser beam (see FIG. 4 below) which can be directed across only certain regions of a chip below which the solder balls 15 are to be found. There is no need to heat the entire chip 14 to heat the solder balls 15 in such a case. Furthermore, our analysis of thermographic types of infrared photographs of the temperature of chips has shown in areas where no solder balls rest below the heated area that there is a very substantial heat buildup in the chip which is undesirable. Obviously, the solder balls 15 provide an excellent heat sink for escape of heat from the lower surface of the chip. In addition, heat transfer laterally along the chip is relatively far slower as compared with heat transfer through a thin chip 14. In such a case, the laser beam must be scanned rapidly across the chip by a rotating and scanning mirror 30 operated under computer control in order to reach only the areas desired in the same manner as electron beam scanning systems employed in exposure of thin film resists and electron beam machining. Thus, only the areas which need heat will receive it. Several scans of a chip 14 are required in such an embodiment before the chip has been heated sufficiently to permit the solder to melt, moving the chip 14 into final position bonded to the package 12.

The work support 11 includes an upper copper block 42 with holes 50 for receiving pins 51 at the bottom of package 12. Block 42 and block 41 sandwich heating coils 40 between them. Coils 40 are employed to heat the package 12 to about 200°–250° C. prior to application of the laser beam 31 so that the heat from beam 31 in the amount required to melt the solder balls 15 is reduced. Thermal shock of chip 14 and package 12 is reduced in this way. Blocks 41 and 42 (composed of copper for good thermal conductivity) are brazed together by means of a copper braze and appropriate flux. The coils 40 within are protected electrically from the copper and silver by a layer of insulation. Block 42 is hollowed out to provide cooling cores 43 filled with coolant. The cores 43 are interconnected (by means not shown) and are connected to a pump and radiator, as is well known to those skilled in the art. The coolant in the cooling cores provides a means of rapidly cooling the package 12, after the chip 14 and the package have been joined together.

The block 42 includes a number of apertures 50 which correspond in location to the pins 51 extending down from the bottom of the package 12. That arrangement is employed in order to maximize the thermal contact between block 42 and package 12.

Coil 40 is heated electrically by A.C. voltage source 46, wires 45 and switch 44, when the switch is closed. When the chips have been joined by the laser, switch 44 is opened and coolant is circulated in the cores 43.

Referring again to FIG. 2, the temperature profile of a chip from time 0 rises for an initial interval of about 5-15 sec. $S_1$ from a low temperature of $T_0$ to a high temperature of $T_1$. Subsequently to that for an interval of 20–40 sec. $t_1$, the temperature remains at value $T_1$. That should be enough time to enable an adequate soldering connection to be made, in most cases. Subsequent to that interval, the temperature drops to level $T_2$ during interval $S_2$. At that point, the chip has been cooled below the melting point of the solder balls 15 and the process has ended essentially.

Figure 3:
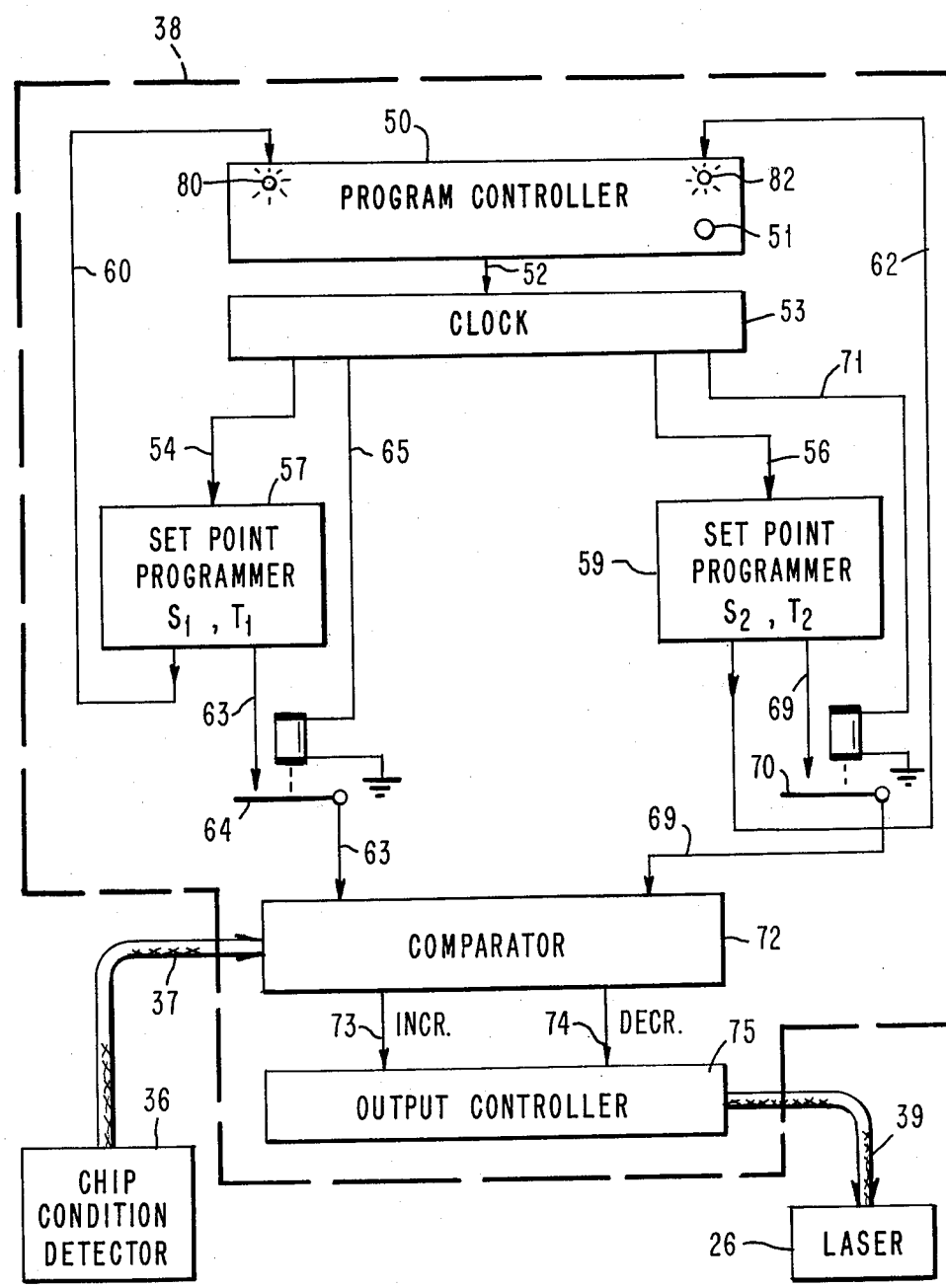
FIG. 3 shows a schematic diagram in greater detail of a portion of the system of FIG. 1.

FIG. 3 shows a block diagram of the control system 38, etc. The chip condition detector 36 which is referred to above as an infrared radiometer or detector (shown in FIG. 3 also) can be any form of sensor which will detect the condition of the chip 14 as a function of heating by the laser beam. It is even conceivable that the detector could be an "Individual Chip Joining Monitor," by S. I. Tan, IBM Technical Disclosure Bulletin, 21, No. 6, 2551-2 (November 1978) which uses an x-y array of detectors shown in block diagram form to detect motion of the chip as the solder melts.

Control system 38 includes program controller 50 with start switch 51 and monitor lights 80, 82 controlled by lines 60, 62 which show where the heating program of FIG. 2 is in its cycle. Controller 50 starts a manually adjustable repeating cycle clock 53 by sending out a signal upon line 52. Clock 53 energizes a set point programmer 57 which is set to heat along line $S_1$ in FIG. 2 to temperature $T_1$ at the end of a manually preset time interval of from 5 to 15 sec. as stated above. The temperature $T_1$ is also preset manually by a manual control on the programmer 57. Line 65 from clock 53 connects line 63 to comparator 72 via switch 64 during heating along line $S_1$ and during the time $t_1$ while temperature $T_1$ is maintained. Next clock 53 turns off line 54, resetting programmer 57 to its start. After time $t_1$ programmer 57 is disconnected from comparator 72 as clock 53 disconnects line 65 by opening relay 64, while energizing set point programmer 59 and line 71 to close relay 70 to connect line 69 to comparator 72 during cooling along line $S_2$ to temperature $T_2$ for the last interval of the program described here. Temperature $T_2$ is held by programmer 59 to the end of the cycle when programmer 59 is reset as line 56 is turned off by clock 53. Actually, a number of other program cycles can be employed as well, but the above description is believed to illustrate how a series of increasing, fixed and declining values of temperature control signals can be generated to control a comparator 72. The comparator receives the output of detector 36, which is compared with the current input to comparator from line 63 or 69. If the temperature of the chip is too high, an output on line 74 is generated to decrease the signal to output controller 75 which adjusts the input to the laser power supply in laser unit 26. If, on the other hand, the comparator 72 determines that the signal on cable 37 is less than the signal on the other comparator input 63 or 69, then a signal on line 73 generates an increase by the output controller 75 in its input to the power supply to laser 26.

Figure 4:
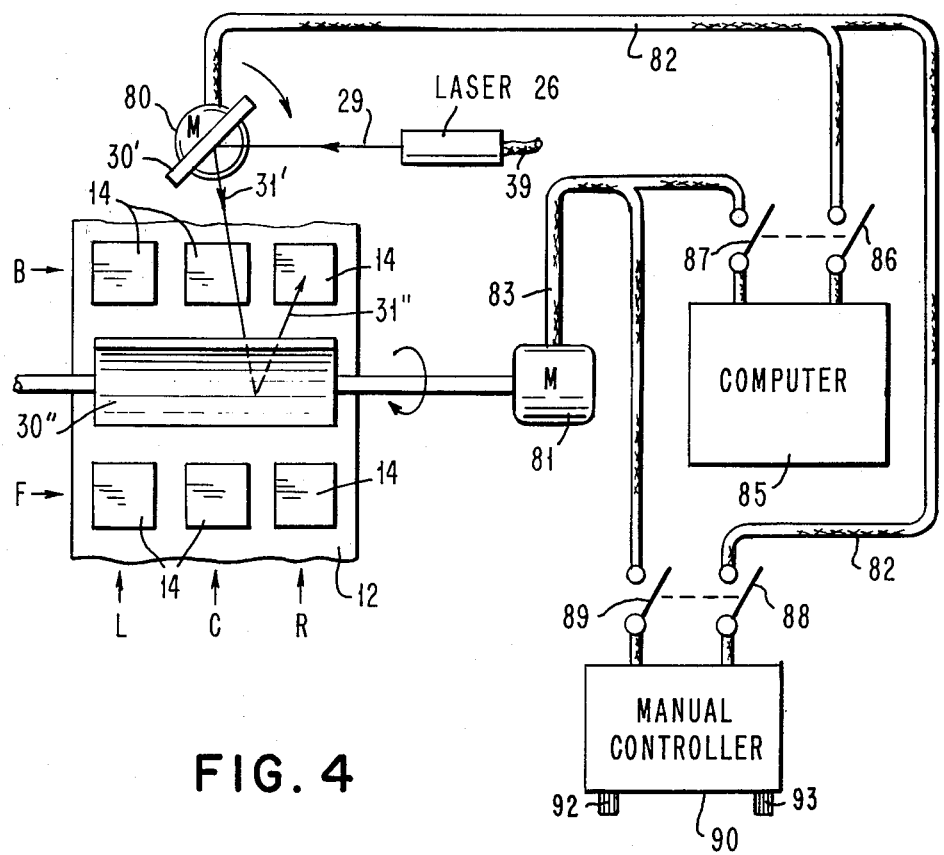
FIG. 4 shows a plan view of a fragment of the system of FIG. 1 with a modified scanning mirror arrangement.

FIG. 4 shows a fragmentary plan view of the structure of FIG. 1 modified to include a modified mirror scanning system with two mirrors driven alternatively by manual or computer (microprocessor) control. A fragment of a package 12 is shown looking down through a window 16 (not shown since it is transparent). Upon package 12 are several chips 14 which may number far, far greater than shown in both the vertical and horizontal directions. A pencil thin laser beam 29 is shown directed at mirror 30' which is tilted slightly about a vertical axis to direct the beam 31' to the right onto another closely spaced mirror 30" which is tilted up slightly about a horizontal axis in the plane of the page parallel to the laser beam 29 so that a doubly reflected laser beam 31" hits the upper right hand chip 14 in the back row rear in FIG. 1, (where the back row cannot be seen since it is a sectional drawing and all the chips are in line). By operating mirror 30' all of the chips in the back or upper row B can be scanned in a straight line if mirror 30" remains fixed, from R (right) to C (center) to L (left), across back row B. If mirror 30' on the other hand is held fixed in place, then the laser can be scanned down column R from row B to row F to any other row (not shown) which is desired. By operating both mirror 30' and mirror 30" in the appropriate sequence one at a time or both together, a scan in the x and y directions can be combined as in the well known computer plotters to scan straight lines as well as complex curves. To drive mirror 30' (x direction), a motor 80 is provided connected by cable 82 through switch 86 or 88 to computer 85 or manual control unit 90. Similarly, mirror 30" is driven by motor 81 which is connected to cable 83 which in turn is connected through switch 89 or 87 to manual control 90 or computer 85 respectively. Motors 80 and 81 are synchros when switches 88 and 89 are closed, permitting turning of manual controls 92 and 93 by a human operator who is supervising the process manually. Alternatively, under automatic process control, motors 80 and 81 are stepping motors. Both sets of motors can be connected to the same shaft for alternative use during development of the proper process controls for optimum cycling of the chips 14 of a specific configuration, or where a single chip is to be removed under manual control rather than entering control information into the microprocessor 85. Of course, the simplest control technique is to turn both of the mirrors 30′ and 30″ with knurled wheels (not shown) on the shafts connected thereto. Scanning should be performed in fractions of a second and repeated over all the lines required to heat the various rows of solder balls 15 under the chip 14. Thus, the most efficient process is to scan with the assistance of the computer 85, which can drive the stepping motors 80 and 81 extremely rapidly.

Industrial Applicability

This invention is useful because the laser frequency can be chosen to provide a minimal penetration depth into the chip. In addition, the energy can be easily directed to the chip from a convenient distance which allows various monitoring gear to be close to the chip without interference.

As to alternative heat sources to lasers, various non-coherent and other coherent energy sources have been tried with limited success. A photographic projection bulb has been used heretofore but had to be placed so close that monitoring was not possible so that necessary control of energy level was impossible. A mini oxyhydrogen flame has been used. Xenon arc lamps are inadequate because they employ 10 Kw which must be focussed into a tiny aperture and filters cut the intensity further.

For successful application of a laser to this problem, many factors of a subtle nature need to be combined to achieve the usefulness of the system described herein.

Ultraviolet radiation is also undesirable because of its deleterious effects upon the flux. Thus, a narrow bandwidth source is preferable and a laser of the appropriate frequency is ideal.

Having thus described my invention, what I claim as new and desire to secure by Letters Patent is:

1. In a system for joining a chip to metal surfaces on a substrate, said chip having an upper and a lower surface and having circuitry on the lower surface thereof along with areas bearing chip joining metal for joining to said metal surfaces when heated, said chip joining metal being employed for connection to said metal surfaces on said substrate, the improvement comprising energy means for directing radiation with wavelengths to which said chip is substantially opaque at the upper surface of said chip.

2. A system in accordance with claim 1 including means for sensing the temperature of said chip, feedback control means having an input controlled by said means for sensing and an output for adjusting the intensity of said energy means for adjusting the intensity of radiation therefrom.

3. A system in accordance with claim 1 wherein scanning mirror means are included between said energy means and said chip, wherein said mirror means provides scanning of said energy across said chip in a predetermined sequence of scans along predetermined paths.

4. A system in accordance with claim 2 wherein scanning mirror means are included between said energy means and said chip, wherein said scanning mirror means provides scanning of said energy across said chip in a predetermined sequence of scans along predetermined paths.

5. A system in accordance with claim 1, 2, 3, or 4 wherein said energy means comprises an argon-ion laser.

6. In a method of joining a chip to metal surfaces on a substrate, said chip having an upper surface and a lower surface and having circuitry on the lower surface thereof along with areas bearing chip joining metal for joining to said metal surfaces when heated, said chip joining metal being employed for connection to said metal surfaces on said substrate, the improvement comprising the step of directing radiation with wavelengths to which said chip is substantially opaque at the upper surface of said chip.

7. A method in accordance with claim 6 including sensing the temperature of said chip and adjusting the intensity of said radiation as a function of said temperature.

8. A method in accordance with claim 6 employing a scanning mirror means between said energy means and said chip to provide scanning of said energy across said chip in a predetermined sequence of scans along predetermined paths.

9. A method in accordance with claim 7 employing a scanning mirror means between said energy means and said chip to provide scanning of said energy across said chip in a predetermined sequence of scans along predetermined paths.

10. A method in accordance with claim 7, 8 or 9 wherein said radiation is an argon-ion laser beam.

* * * * *